United States Patent [19]

Michel et al.

[11] Patent Number: 4,620,968

[45] Date of Patent: Nov. 4, 1986

[54] MONOCLINIC PHOSPHORUS FORMED FROM VAPOR IN THE PRESENCE OF AN ALKALI METAL

[75] Inventors: Christian G. Michel, Ossining; Rozalie Schachter, New York, both of N.Y.; Mark A. Kuck, Upper Montclair, N.J.; John A. Baumann, Dobbs Ferry, N.Y.; Paul M. Raccah, Chicago, Ill.

[73] Assignee: Stauffer Chemical Company, Westport, Conn.

[21] Appl. No.: 419,537

[22] Filed: Sep. 17, 1982

Related U.S. Application Data

[63] Continuation-in-part of Ser. No. 335,706, Dec. 30, 1981, abandoned.

[51] Int. Cl.$^4$ .................... C01B 25/00; C01B 25/01; C01B 25/02; C04B 35/00
[52] U.S. Cl. .................... 423/299; 423/322; 252/62.3 ZB; 252/62.3 E
[58] Field of Search ............... 423/316, 299, 322, 323; 252/62.3 ZB, 62.3 E

[56] References Cited

U.S. PATENT DOCUMENTS

| | | | |
|---|---|---|---|
| 3,127,226 | 3/1964 | Rector | 316/4 |
| 3,361,591 | 1/1968 | Dill et al. | 117/201 |
| 3,446,936 | 5/1969 | Hanson et al. | 219/271 |
| 3,716,844 | 2/1973 | Brodsky | 340/173 |
| 3,864,717 | 2/1975 | Merrin | 357/2 |

(List continued on next page.)

FOREIGN PATENT DOCUMENTS

| | | | |
|---|---|---|---|
| 688221 | 6/1964 | Canada | 423/322 |
| 2547552 | 10/1975 | Fed. Rep. of Germany | 118/723 |
| 143705 | 9/1980 | German Democratic Rep. | 423/322 |
| 79/00724 | 10/1979 | PCT Int'l Appl. | 427/39 |
| 79/00776 | 10/1979 | PCT Int'Appl. | 427/85 |

OTHER PUBLICATIONS

J. D. Jensen and R. B. Schoolar, "Surface Charge Transport in $PbS_xSe_{1-x}$ and $Pb_{1-y}Sn_ySe$ Epitaxial Films", *J. Vac. Sci. Technol*, vol. 13, No. 4, p. 920, 1976.

J. Donahue, "Phosphorus", *The Structures of the Elements*, pp. 289-303, 403-436, 1974.

A. Wold and R. Kaner, "Preparation of Transition Metal Phosphides and Silicides from Metal Fluxes", 181 American Chemical Society Meeting, INOR No. 117, 1980.

(List continued on next page.)

Primary Examiner—Gregory A. Heller
Attorney, Agent, or Firm—F. Eugene Davis, IV

[57] ABSTRACT

Monoclinic phosphorus is produced in a single source vapor transport apparatus comprising a sealed evacuated ampoule containing a mixture or compound of phosphorus and an alkali metal with the phosphorus to alkali metal ratio being 11 or greater. The charge is heated to 550°–560° C. and the monoclinic phosphorus crystals are formed on the cooler surface at the top of the ampoule over the temperature range of 500°–560° C. The preferred heating temperature is in the neighborhood of 555° C. and the preferred deposition temperature is in the neighborhood of 539° C. Alkali metals that may be employed include sodium, potassium, rubidium and cesium. The monoclinic phosphorus crystals form in two habits. Those formed in the presence of sodium and cesium are in the form of flat square platelets up to 4 mm on a side and 2 mm thick. These platelets may be easily cleaved into thinner platelets, like mica. The other habit formed in the presence of potassium and rubidium is in the form of a truncated pyramid up to 4 mm×3 mm×2 mm high. This habit is hard to cleave. The crystals are semiconductors with a band gap, indicated by photoluminescence, of about 2.1 eV at room temperature. Powder X-ray diffraction, and differential thermal analysis are consistent with that reported for Hittorf's phosphorus prepared according to the prior art. The crystals are a deep red on transmission and birefringent, rotating the plane of polarization in a polarizing microscope. They contain from 50 to 2000 parts per million of alkali metal and therefore may be utilized as a form of very pure phosphorus as well as for their semiconducting and birefringent qualities and as phosphors.

11 Claims, 8 Drawing Figures

U.S. PATENT DOCUMENTS

| | | | |
|---|---|---|---|
| 3,983,542 | 9/1976 | Ovshinsky | 340/173 |
| 4,013,756 | 3/1977 | Lowe et al. | 423/322 |
| 4,177,473 | 12/1979 | Ovshinsky | 357/2 |
| 4,177,474 | 12/1979 | Ovshinsky | 357/2 |
| 4,217,374 | 8/1980 | Ovshinsky et al. | 427/39 |
| 4,226,898 | 10/1980 | Ovshinsky et al. | 427/39 |
| 4,286,545 | 9/1981 | Takagi et al. | 118/723 |

OTHER PUBLICATIONS cpD. Adler, "Chemistry and Physics of Amorphous Semiconductors", *Journal of Chemical Education*, vol. 57, No. 8, pp. 560–564, Aug. 1980.

F. Yonezawa, *Fundamental Physics of Amorphous Semiconductors*, p. 20, Springer–Verlag, 1981, Proceedings of the Kyoto Summer Institute, Kyoto, Japan, Sep. 8–11, 1980.

D. Beecham, "Cadmium/Sulfur Isothermal Source for CdS Deposition", *The Review of Scientific Instruments*, vol. 41, No. 11, p. 1654, 1970.

K. Shimakawa, Y. Inagaki, S. Nitta, and T. Arizumi, "Dependences of the Resistivity and the Switching on Composition in Chalcogenide Glasses", *Japan J. Appl. Phys.* 10, pp. 956–957, 1971.

H. U. Beyeler and S. Veprek, "Radial Distribution Function of Amorphous Phosphorus Prepared by Chemical Transport in a Low Pressure Hydrogen Plasma", *Philosophical Magazine B*, vol. 41, No. 3, pp. 327–340, 1980, U.K.

D. J. Smith and W. M. Stobbs, "Investigations on the Structure of Amorphous Phosphorus", *Inst. Phys. Conf. Ser. No. 52*, Chapter 10, pp. 457–460, 1980.

D. J. Braun and W. Jeitschko, "The Synthesis and Crystal Structure of the Polyphosphides $La_6Ni_6P_{17}$, $Ce_6Ni_6P_{17}$, and $Pr_6Ni_6P_{17}$", *Acta Cryst*, B34, pp. 2069–2074, 1978.

W. E. Spear, P. G. Le Comber, S. Veprek and R. Wild, "Electronic Properties of Amorphous Phosphorus Prepared by Chemical Transport in a Glow Discharge", *Philosophical Magazine B*, vol. No. 4, pp. 349–355, 1978.

M. H. Brodsky, Ed., *"Amorphous Semiconductors"*, pp. 3, 5, 44, 216–218, 224–225, 241–243, Springer–Verlag, 1979.

P. B. Kirby and E. A. Davis, "Photoluminescence from Amorphous Phosphorus", *Journal of Non-Crystalline Solids*, 35 & 36, pp. 945–950, 1980.

J. Brunner, M. Thuler, S. Veprek and R. Wild, "X-Ray Photoelectron Study of Amorphous Phosphorus Prepared by Plasma Chemical Transport, Comparison with Crystalline Polymorphs", *J. Phys. Chem. Solids*, vol. 40, pp. 967–971, 1979, U.K.

V. I. Kosyakov and I. G. Vasil'eva, "Phosphorus Rings, Clusters, Chains, and Layers", Russian Chemical Reviews, 48(2), pp. 153–161, 1979; [translated from Uspekhi Khimii, 48, pp. 280–296 (1979)].

A. Catalano and R. B. Hall, "Defect Dominated Conductivity in $Zn_3P_2$", *J. Phys. Chem. Solids*, vol. 41, pp. 635–640, 1980.

V. Kosyakov and I. Vasilyeva, "Relation [Correlation] Between the Structure and Properties of Polyphosphides", *Poluprovdn. Materialy i Ikh. Primenenie Voronezh*, pp. 143–153, 1977, USSR.

D. E. C. Corbridge, *Phosphorus, An Outline of Its Chemistry, Biochemistry and Technology* (2nd Edition), "Studies in Inorganic Chemistry 2", Chapter 2, Phosphides and Single Compounds, Elsevier Scientific Publishing Co., 1980.

V. Kosyakov and I. Vasilyeva, "Structural Classification of Polyphosphides", *Poluch. svoistra i primenenie Fosfidov*, pp. 17–22, 1977, USSR.

D. E. C. Corbridge, *Structural Chemistry of Phosphorus*, Elsevier Scientific Publishing Co., Amsterdam, Chapter 2, "Phosphorus: The Element", pp. 13–24, 42–44, 46–47, 56–58, 61–63, 1974.

H. Krebs and Th. Ludwig, "About Crystallized Metal Polyphosphides, III, The Structure of the Metal Phosphides of the Type $HgPbP_{14}$", *Z. Anorg. Allg. Chem.* 294, pp. 257–266, 1958, Germany.

V. L. Dalal, B. N. Baron and T. W. F. Russell, "Technology Considerations for Thin Solar Cells", *American Section International Solar Energy Society*, Jun. 2–6, 1980, U.S.

H. Krebs, I. Pakulla, and G. Zurn, "About Crystallized Metal Polyphosphides. I", *Z. Anorg. Allg. Chem.* 278, pp. 274–286, 1955, Germany.

E. A. Davis, "Review of Group-V Amorphous Semiconductors", *Journal De Physique*, Colloque C4, supplement au No. 10, Tome 42, Oct./1981, pp. 855–864.

J. S. Lannin and B. V. Shanabrook, "Raman Scattering and Infrared Absorption in Bulk Amorphous Red Phosphorus", *Solid State Communications*, vol. 28, pp. 497–500, 1978, U.K.

*Encyclopaedia Britannica*, "Semiconductor Devices", and Solid State of Matter, vol. 16, pp. 512–529, 1032–1043, (1974), William Benton, publisher, U.S.

T. S. Moss, "Photoconductivity in the Elements", *Proc. Phys. Soc.*, vol. 64A, pp. 590–591, 1951.

E. A. Fagen, "Optical Properties of $Zn_3P_2$", *J. Appl. Phys.*, vol. 50, No. 10, pp. 6505–6515, 1979.

F. Grandjean, A. Gerard, U. Krieger, C. Heiden, D. J. Braun and W. Jeitschko, "A Mössbauer Investigation of Diamagnetic, Semiconducting Alpha-$FeP_4$", *Solid State Communications*, vol. 33, pp. 261–264, 1980.

K. E. Pachali, W. Ott, and H. Thurn, "The Crystal Structure of $ZnSnP_{14}$ And Its Relationship to Hittorf Phosphorus And Other Polyphosphides:", *Acta Cryst.* A31, Suppl. 3, p. 69, 1976, Germany.

G. Haacke and G. A. Castellion, "Preparation and Semiconducting Properties of $Cd_3P_2$", *J. Appl. Phys.*, vol. 35, No. 8, pp. 2484–2487, 1964.

(List continued on next page.)

OTHER PUBLICATIONS

K. E. Petersen, D. Adler, and M. P. Shaw, "Amorphous-Crystalline Heterojunction Transistors", *IEEE Transactions on Electron Devices*, vol. ED-23, No. 4, pp. 471-477, Apr./1976, U.S.

Y. Hamakawa, "Amorphous Semiconductor Technologies & Devices", North Holland Publishing Company, Introductory pages, Preface, Table of Contents, Chapter 1, 1982, (Copyright 1981) Japan.

H. Richter and L. Ley, "Optical Properties and Transport in Microcrystalline Silicon Prepared at Temperatures Below 400° C.", *J. Appl. Phys.*, 52(12), Dec./1981, U.S.

W. Honle, "Uber Niedere Phosphide, Arsenide und Antimonide der Alkalimetalle", *Dissertation University of Munster*, 1975, Germany.

W. L. Roth, T. W. DeWitt and A. J. Smith, "Polymorphism of Red Phosphorus", *J. Am. Chem. Soc.* 69, pp. 2881-2885, 1947, U.S.

W. Jeitschko and D. J. Braun, "Synthesis and Crystal Structure of the Iron Polyphosphide $FeP_4$", *Acta Cryst.*, B34, pp. 3196-3201, 1978.

M. Rubenstein and F. M. Ryan, "Allotropes of Red Phosphorus", *Journal of the Electrochemical Society*, pp. 1063-1067, Oct./1966.

W. Jeitschko and M. H. Möller, "The Crystal Structures of $Au_2P_3$ and $Au_7P_{10}I$, Polyphosphides with Weak Au-Au Interactions", *Acta Cryst.*, B35, pp. 573-579, 1979.

H. Schafer, B. Eisenmann and W. Muller, "Zintl Phases: Transitions between Metallic and Ionic Bonding", German version: *Angew. Chem.* International Edition, pp. 691-711, 1973.

W. Jeitschko and R. Rühl, "Synthesis and Crystal Structure of Diamagnetic $ReP_4$, a Polyphosphide with Re-Re Pairs", *Acta Cryst.*, B35, pp. 1953-1958, 1979.

W. Schmettow, "Uber Die Phosphide Des Rubidiums", *Dissertation*, University of Münster, 1975, Germany.

S. Ovshinsky and D. Adler, "Local Structure, Bonding, and Electronic Properties of Covalent Amorphous Semiconductors", *Contemp. Phys.* vol. 19, No. 2, pp. 109-126, 1978.

H. Schmidt, "Chemistry and Structural Chemistry of the Polyphosphides of Alkaline Metals, The Crystalline Structures of $KP_{15}$, $RbP_{11}$, and $CsP_{11}$", *Dissertation*, Westfälische Wilhelms University Munster, 1970, Germany.

B. V. Shanabrook and J. S. Lannin, "Vibrational and Structural Properties of Thin Film Amorphous Phosphorus", pp. 166-167, Meeting of American Physical Society Mar./1980, sessions AF5, U.S.

B. V. Shanabrook, J. S. Lannin, and P. C. Taylor, "Far Infrared Absorption in Bulk Amorphous Red Phosphorus", *Solid State Communications*, vol. 32, pp. 1279-1283, 1979, U.K.

V. Ya. Shevchenko and S. F. Marenkin, "Preparation of Single Crystals of Semiconducting $A^{II}B^V$ Compounds", N. S. Kurnakov Institute of General and Inorganic Chemistry, Academy of Sciences of USSR, UDC 537.311.33, pp. 871-873, 1979, as translated from *Izvestiya akademii Nauk SSSR, Neorganicheskie Materialy*, vol. 15, No. 6, pp. 1106-1107, Jun./1979.

W. E. Spear and P. G. Le Comber, "Substitional Doping of Amorphous Silicon", *Solid State Communications*, vol. 17, pp. 1193-1196, 1975.

C. C. Stephenson, R. L. Potter, T. G. Maple, and J. C. Morrow, "The thermodynamic properties of elementary phosphorus", *J. Chem. Thermodynamics*, pp. 59-76, 1969.

H. Thurn and H. Krebs, "Crystal Structure of Violet Phosphorus", *Angew. Chem. Internat. Edit.*, vol. 5, No. 12, pp. 1047-1048, 1966.

H. Thurn and H. Krebs, "Uber Struktur and Eigenschaften der Halbmetalle, XXII. Die Kristallstruktur des Hittorfschen Phosphors", *Acta Cryst.* B25, pp. 125-134, Germany 1969.

J. R. Van Wazer, *Phosphorus and Its Compounds*, vol. I: Chemistry, Interscience Publishers, Inc., N.Y., pp. 93-177, 1966, U.S.

H. G. von Schnering and H. Schmidt, "$KP_{15}$, A New Potassium Polyphosphide", *Angew. Chem.*, Int. Ed. 6, p. 356, 1967.

H. G. von Schnering, "Catenation of Phosphorus Atoms", *Homoatomic Rings, Chains Macromolecules*, Main-Group Elements. Chapter 14, pp. 317-348, edited by A. L. Rheingold, Elsevier Scientific Publishing Co., Amsterdam, 1977.

H. G. von Schnering, M. Whittmann, R. Nesper; "Dithorium Undecaphosphide $Th_2P_{11}$, A polyphosphide with a One-dimensional Superstructure Generated by a Periodic Change in the Covalent Bonds", *J. Less-Common Met.*, vol. 76, No. 1-2, 213-226, Dec./1980.

D. Warschauer, "Electrical and Optical Properties of Crystalline Black Phosphorus", *Journal of Applied Physics*, vol. 34, No. 7, pp. 1853-1860, Jul./1963, U.S.

MONOCLINIC PHOSPHORUS FORMED FROM VAPOR IN THE PRESENCE OF AN ALKALI METAL

RELATED APPLICATIONS

This application is a continuation-in-part of our, now abandoned, co-pending application entitled CATENATED SEMICONDUCTOR MATERIALS OF PHOSPHORUS, METHODS AND APPARATUS FOR PREPARING AND DEVICES USING THEM, filed Dec. 30, 1981, Ser. No. 335,706, which application is incorporated herein by reference.

TECHNICAL FIELD

This application relates to monoclinic phosphorus formed from vapor in the presence of an alkali metal. More particularly it relates to such monoclinic phosphorus formed by a single source vapor transport technique.

BACKGROUND ART

Monoclinic phosphorus, also called Hittorf's phosphorus, is prepared according to the prior art as follows: 1 g of white phosphorus and 30 g of lead are heated slowly in a sealed tube to 630° C. and held for a short time at that temperature. The solution is then cooled at the rate of 10° per day for 11 days to 520° C., and cooled rapidly to room temperature thereafter. It is next electrolyzed in a solution of 2 kg of lead acetate in 8 liters of 6% acetic acid, and the phosphorus is collected in a watch glass placed under the anode. Nearly square tabular crystals, about 0.2×0.2×0.05 mm, are obtained in this way.

The structure of this prior art monoclinic phosphorus has been determined by Thurn and Krebs. The crystals comprise two layers of pentagonal tubes of phosphorus with all of the tubes parallel, and then another pair of layers of all pentagonal tube phosphorus, the tubes in the second pair of layers all being parallel, but the tubes in the second pair of layers being perpendicular to the tubes in the first pair of layers. The space group of the crystal has been determined, as well as the bond angles and bond distances. See the summary of the prior art in the section "Phosphorus" from "The Structure of the Elements" by Jerry Donahue, published in 1974.

Because of the small size of the crystals produced by means of the prior art technique, their electronic properties have not been determined.

The preparation of high purity electronic grade phosphorus according to the prior art is very complex and time consuming, thus electronic grade phosphorus is very expensive.

DISCLOSURE OF THE INVENTION

We have produced large crystals of elemental phosphorus in sealed evacuated ampoules such as illustrated in FIGS. 1 through 3. The ampoules are heated to 550°–560° C. and contain either a mixture or compound of phosphorus and an alkali metal. The crystals are formed at a colder portion of the ampoule, maintained at a temperature between 500° and 560° C. and preferably at about 539° C. We have produced monoclinic phosphorus crystals from charges of $KP_{15}$, $Rb_{15}$, $CsP_{15}$, and $NaP_{15}$, and from mixtures of $Cs/P_{11}$ and $K/P_{15}$, $K/P_{30}$, and $K/P_{125}$.

Charges containing potassium and rubidium produce truncated pyramidal shaped crystals as shown in FIG. 4. These crystals are hard to cleave. Charges of sodium and cesium produce platelets similar to a deck of cards as shown in FIG. 5, which peel apart easily to any thinness desired, like mica.

The largest crystals we have produced in the habit shown in FIG. 4 are 4×3 mm×2 mm high. The largest crystals we have produced in the habit shown in FIG. 5 are 4 mm square and 2 mm thick.

The crystals are metallic looking on reflection and deep red in transmission. Electron spectroscopy for chemical analysis indicates that they contain anywhere from 50 to 2000 part per million of alkali metal. Their powder X-ray diffraction patterns, Raman spectra and differential thermal analysis are all consistent with the prior art Hittorf's phosphorus.

Photoluminescence of crystals grown in the presence of Cesium in FIG. 6 and crystals grown in the presence of Rubidium in FIG. 7 shows peaks at 4019 and 3981 $cm^{-1}$, which indicate a band gap of 2.1 eV at room temperature for this monoclinic phosphorus.

The crystals may be utilized as a source of high purity phosphorus; as optical rotators in the red and infra-red portion of the spectrum (they are birefringent); as substrates for the growth of 3–5 materials such as Indium Phosphide and Gallium Phosphide. They may be utilized in luminescent displays and when appropriately doped, as lasers.

OBJECTS OF THE INVENTION

It is therefore an object of the invention to provide large crystals of monoclinic phosphorus.

Another object of the invention is to provide high purity phosphorus.

A further object of the invention is to provide a substrate for 3–5 materials.

Still another object of the invention is to provide a new semiconductor material.

Yet still another object of the invention is to provide material for luminescent displays.

A further object of the invention is to provide materials for semiconductor lasers.

Still another object of the invention is to provide a birefringent material for use in the red and infra-red portion of the spectrum.

Yet still another object of the invention is to provide methods for making materials of the above character.

A further object of the invention is to provide such methods which are more convenient than the prior art and less expensive.

Other objects of the invention will in part be obvious and will in part appear hereinafter.

The invention accordingly comprises several steps and the relation of one or more of such steps with respect to each of the others, and the composition of matter possessing the features, properties, and the relation of components, which are exemplified in the following detailed disclosure. The scope of the invention is indicated in the claims.

BRIEF DESCRIPTION OF THE DRAWINGS

For a fuller understanding of the nature and objects of the invention, reference should be had to the following detailed description taken in connection with the accompanying drawings in which.

The same reference numbers refer to the same elements throughout the several views of the drawings.

BEST MODE FOR CARRYING OUT THE INVENTION

Preparation

Cesium

In our initial experiment, a 0.4 g sample of $Cs/P_{11}$ ball-milled mixture prepared as indicated in the above identified application, was maintained in vacuo at 550° C. for 16 hours in an 8 mm (outside diameter)×4 mm (inside diameter) Pyrex tube and then water-quenched. What we found is shown in FIG. 1.

Figure 1:
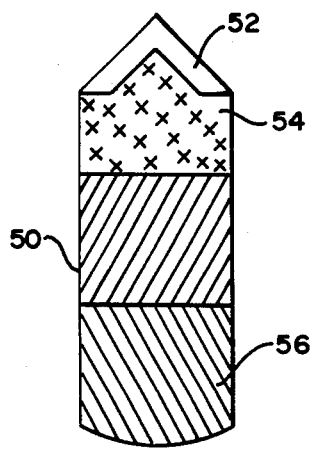
FIG. 1 is a schematic representation of a sealed ampoule in which monoclinic phosphorus is formed according to the invention.

Now referring to FIG. 1, the ampoule 50 is sealed at the top 52 and is found to contain metallic grey whiskers 54 above a glassy boule 56.

Above the glassy boule were several dozen metallic grey whiskers, some as long as 12 mm. While examining the whiskers under a microscope we found several small translucent red platelets present which appeared to be Hittorf's phosphorus. The platelets proved to be air-stable.

Figure 2:
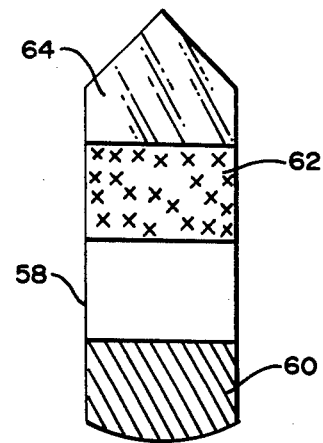
FIG. 2 is a schematic representation of a sealed ampoule similar to that shown in FIG. 1 in which monoclinic phosphorus is formed according to the invention.

In the next scaled-up experiment, a 1.5 g sample of the same $Cs/P_{11}$ mixture was heated in a 12 mm O.D.×8 mm I.D. tube in vacuo at 554° C. for 40 hours and then water-quenched. Again we found more than one product (see FIG. 2).

In the bottom of the reaction tube 58 was a somewhat glassy grey boule 60. The top quarter of the tube was filled with a boule 62 which seemed to be made up of two materials. The lower part of this boule 62 was in the form of metallic grey fibers. The upper part consisted of a red, translucent material 64 from which platelets could be cleaved. This red region appeared to consist of single crystals which were embedded in the polycrystalline metallic grey material.

DTA results secured earlier indicate the following melting points:

| MATERIAL | MELTING POINT (°C.) |
|---|---|
| Hittorf's Phosphorus | approximately 628 |
| $CsP_7$ condensed phase | 480–490 |
| $CsP_{15}$ condensed phase | approximately 600 |

The experiments just described were conducted isothermally at 550° and 554° C. These temperatures are above the melting point of $CsP_7$ but well below the melting points of both $CsP_{15}$ and Hittorf's phosphorus. In view of the reaction temperatures used, the materials in the top of the reaction chambers must have melting points greater than 550° C. Consistent with the DTA melting point data cited, $CsP_{15}$ could account for the metallic grey whiskers and fibers and Hittorf's phosphorus the translucent red plates. $CsP_7$ could account for the lower melting point bottom glassy boule.

Subsequent DTA results have partially confirmed that these are the products. The red platelets were found to exhibit a single strong endotherm—at 622° C. on first heat. The glassy grey boule produced in the second experiment was found to exhibit a strong first-heat exotherm—at 312° C. and an endotherm at 491° C. These thermal events are characteristic of $CsP_7$.

We have not yet characterized the whiskers and fibrous materials produced. However, the results strongly suggest that the Cs/P system under these conditions favors the formation of "large" crystal Hittorf's phosphorus. No cesium was detected by emission spectroscopy on a small (approximately 1 mg) sample of the red platelets. However, since the determination was made on such a small sample the maximum level of cesium present could not be estimated with any accuracy.

In a subsequent experiment a 1.2 g sample of the $Cs/P_{11}$ mixture was heated in an 11 mm outside diameter×6 mm inside diameter Pyrex tube in vacuo at 554°–556° C. for 66 hours. Again, we observed that two boules had formed. However, in this case the red translucent crystals accounted for approximately 95% of the top boule and facets with 1.0–1.5 mm long edges were found protruding from the boule.

It should be noted that the red crystalline material always forms at the very top of the reaction chamber. Thus, it must form early in the experiment. This would of course be the time when the P/Cs ratio is highest. It would thus appear that formation of the red translucent crystals in the cesium/phosphorus system is favored in a phosphorus-rich environment; and that, when the ratio drops to a certain value, $CsP_{15}$ is the preferred product. Hence, we observe that the lower part of the top boule is fibrous, metallic grey—characteristic of a polyphosphide.

We have recently found that the red crystals can also be produced by heating $CsP_{15}$ produced by our condensed phase method in vacuo at 555° C. for 92 hours.

Powder X-ray diffraction data on the translucent red crystals produced from the $Cs/P_{11}$ (ball milled) and condensed phase $CsP_{15}$ samples is consistent with that reported for Hittorf's (violet) phosphorus. Emission spectrographic analysis of a large sample of the red platelets indicates a cesium content of 80–800 parts per million.

We have found that the results are indeed reproducible—that the red platelets can be repeatedly made by heating the $Cs/P_{11}$ (ball milled) material at 555° C. However, we recently secured a result which suggests that temperature is critical. A tube containing $Cs/P_{11}$ (B.M.) was heated in vacuo at 545° C. for 135 hours. The reaction tube was found to contain a single grey boule—at the top of the tube. The boule was made up of a homogeneous mass of fibers.

Potassium

We have found that red, translucent crystals can be prepared by heating $KP_{15}$ formed by our condensed phase process in vacuo isothermally at 556° C. for approximately 96 hours. The crystals produced are smaller than those made from the cesium/phosphorus systems and of a different crystal habit. However, the XRD data secured is very similar to that secured earlier on the crystals produced from Cs/$P_{11}$ ball-milled.

We have also produced small red, translucent crystals from ball milled mixtures of K/$P_{30}$ and K/$P_{125}$.

Rubidium

We have found that the $RbP_{15}$ prepared by our condensed phase process can also be utilized to produce large crystal monoclinic phosphorus.

A 0.62 g sample of $RbP_{15}$ encapsulated, in vacuo, in a 10 mm O.D.×6 mm I.D.×5.0 cm quartz tube was vertically positioned in a crucible furnace and subjected to a temperature gradient such that the $RbP_{15}$ charge was maintained at 552° C. while the top of the tube was maintained at 539° C. After heating for approximately 22 hours, the tube was opened and single crystals of monoclinic phosphorus, as large as 3.0 mm on edge, were found in the upper (cooler) region of the tube. Thus, while monoclinic phosphorus can be produced from cresium-, potassium-, sodium- (see below) and rubidium-phosphorus systems; the latter has resulted in the best quality single crystals.

Cesium and Sodium

Single crystals of monoclinic phosphorus were grown via vapor transport using either $CsP_{15}$ or $NaP_{15}$ charges formed in our condensed phase process. In each run approximately 0.5 g of the appropriate alkali metal polyphosphide was sealed in vacuo in a quartz tube (10 mm O.D.×6 mm I.D.) of length 8.9 cm. The tubes were then subjected to a temperature gradient such that the alkali metal polyphosphide charges were maintained at 558° C. while the tops of the tubes were maintained at 514° C. After 48 hours, large deep-red crystalline stacked square platelets of monoclinic phosphorus formed from the $CsP_{15}$ charges. After 130 hours, small crystalline platelets of monoclinic phosphorus had formed in the tube containing the $NaP_{15}$ charge.

The morphologies of the monoclinic phosphorus crystals grown from $CsP_{15}$ and $NaP_{15}$ condensed phase charges appear to be very similar, that is, stacked square platelets. This is in contrast to the truncated pyramidal habit of the monoclinic phosphorus crystals grown from $RbP_{15}$ (condensed phase) and $KP_{15}$ (condensed phase) charges.

Effect of Temperature

While the nature of the alkali metal present seems not to be important, the temperature at which the charge is maintained is apparently very important to the crystal growth process. In the case of the Cs/$P_{11}$ ball milled system, large crystals were produced in experiments where the charge was maintained at 555° C. and 554° C. However, in experiments where the charge was held at 565° C. and 545° C., no monoclinic crystals were produced.

Figure 3:
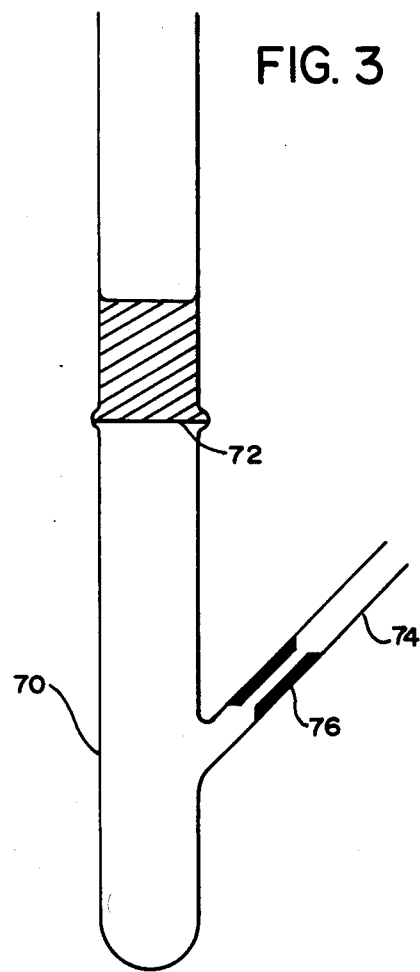
FIG. 3 is a diagram of a preferred form of sealed ampoule utilized in the invention.

Referring to FIG. 3, using our preferred apparatus, we sealed a 0.6 gm sample of $RbP_{15}$ prepared by our condensed phase process in vacuo in a 12 mm O.D.×6 mm I.D.×8 cm long glass tube 70. The top was sealed with a 16 mm diameter flat glass surface 72. Fill tube 74 is provided with a constriction 76 at which it is seal after charging and evacuation.

The tube was subjected to a temperature gradient such that the flat surface 72 at the top of the tube was maintained at 462° C., while the charge at the bottom of the tube was maintained at 550° C. After heating for 140 hours approximately half of the original charge had been transported to the flat surface.

The resulting button-like boule was cleaved and examined. It was made up entirely of uniform light-red fibers which we have determined to be a crystalline form of phosphorus, but not monoclinic phosphorus.

We conclude that the condensing temperature should be in the range of 500° to 560° C. Further experiment indicates that the preferred condensing temperature is about 539° C.

The charge must be heated to a temperature above 545° C. and below 565° C. as previously indicated. Our preferred range is 550° to 560° C. with about 555° C. giving the best results.

Effect of Composition

When we used a ball-milled mixture of Rb/$P_{11}$ with a temperature gradient from 550° C. to approximately 539° C., nearly all of the material was converted to fibers of $RbP_{11}$. Thus we have produced monoclinic phosphorus from charge ratios of P to alkali metal of 11 to 125. However a ratio of about 15 seems to work best.

Figure 4:
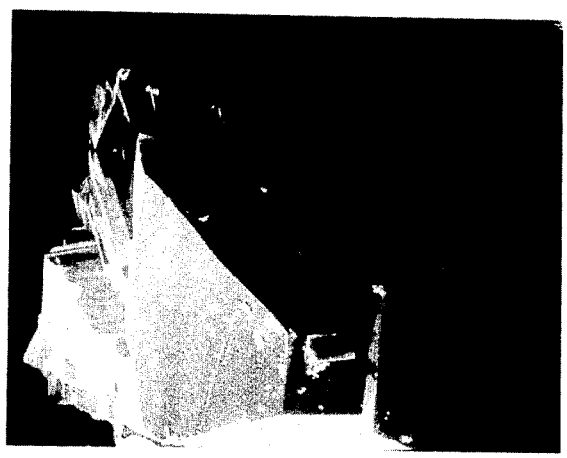
FIG. 4 is a photomicrograph of a crystal of monoclinic phosphorus according to the invention.

Characteristics of Monoclinic Phosphorus Condensed from Vapor in the Presence of an Alkali Metal FIG. 4 is a photomicrograph at 50× magnification showing a pyramidally shaped monoclinic crystal of phosphorus prepared from a Rubidium $P_{15}$ charge. These crystals are hard to cleave. Similar crystals are produced from charges utilizing potassium as the alkali metal. We have produced crystals as large as 4×3×2 mm.

Figure 5:
FIG. 5 is a photomicrograph of a crystal of monoclinic phosphorus according to the invention.

FIG. 5 is a photomicrograph, at 80× magnification, of a crystal of monoclinic phosphorus produced from a ball milled mixture of Cs/$P_{11}$. These platelets are easy to cleave into mica-like sheets. Similar crystals can be produced from a charge of sodium $P_{15}$. We have produced crystals in this habit as large as 4 mm on the side and 2 mm thick.

In transmission the crystals are a deep red; on reflection they are metallic and look somewhat like copper.

We have determined that the crystals are birefringent. When placed between crossed polarizers in a polarizing microscope, they rotate the light and allow some of it to pass through. Thus they may be utilized as birefringent devices such as optical rotators in the red and infra-red portion of the spectrum.

Electron spectroscopy for chemical analysis indicates that they contain anywhere from 50 to 2000 parts per million of an alkali metal. Thus they are very high purity phosphorus and may be utilized as such. They are made in a process which takes as little as 22 hours versus the 11 days employed in the process of the prior art to produce Hittorf's phosphorus.

The powdered X-ray diffraction pattern of these crystals is consistent with that of the prior art Hittorf's phosphorus.

Figure 6:
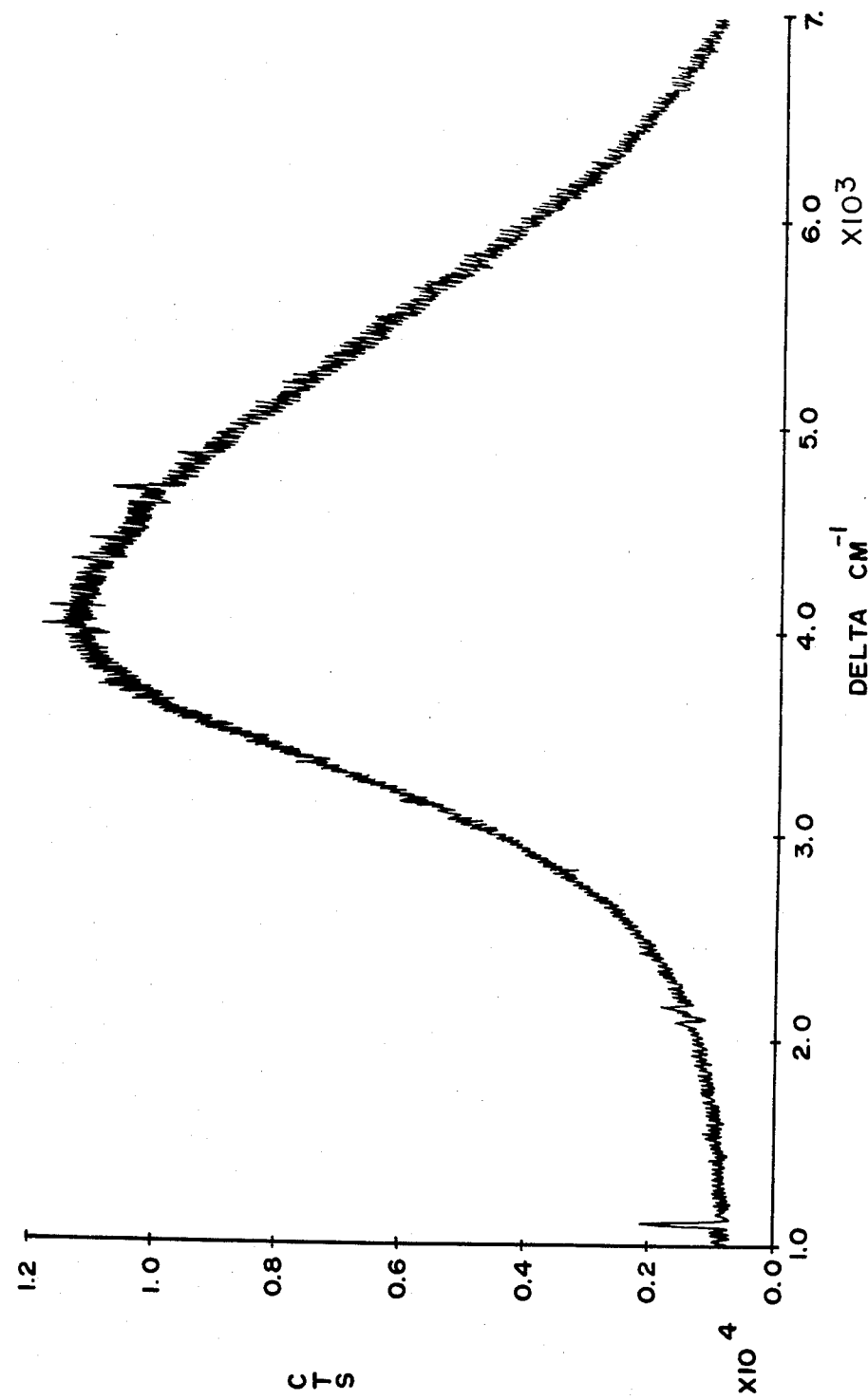
FIG. 6 is a diagram of the photoluminescence response of a crystal of monoclinic phosphorus according to the invention.
Figure 7:
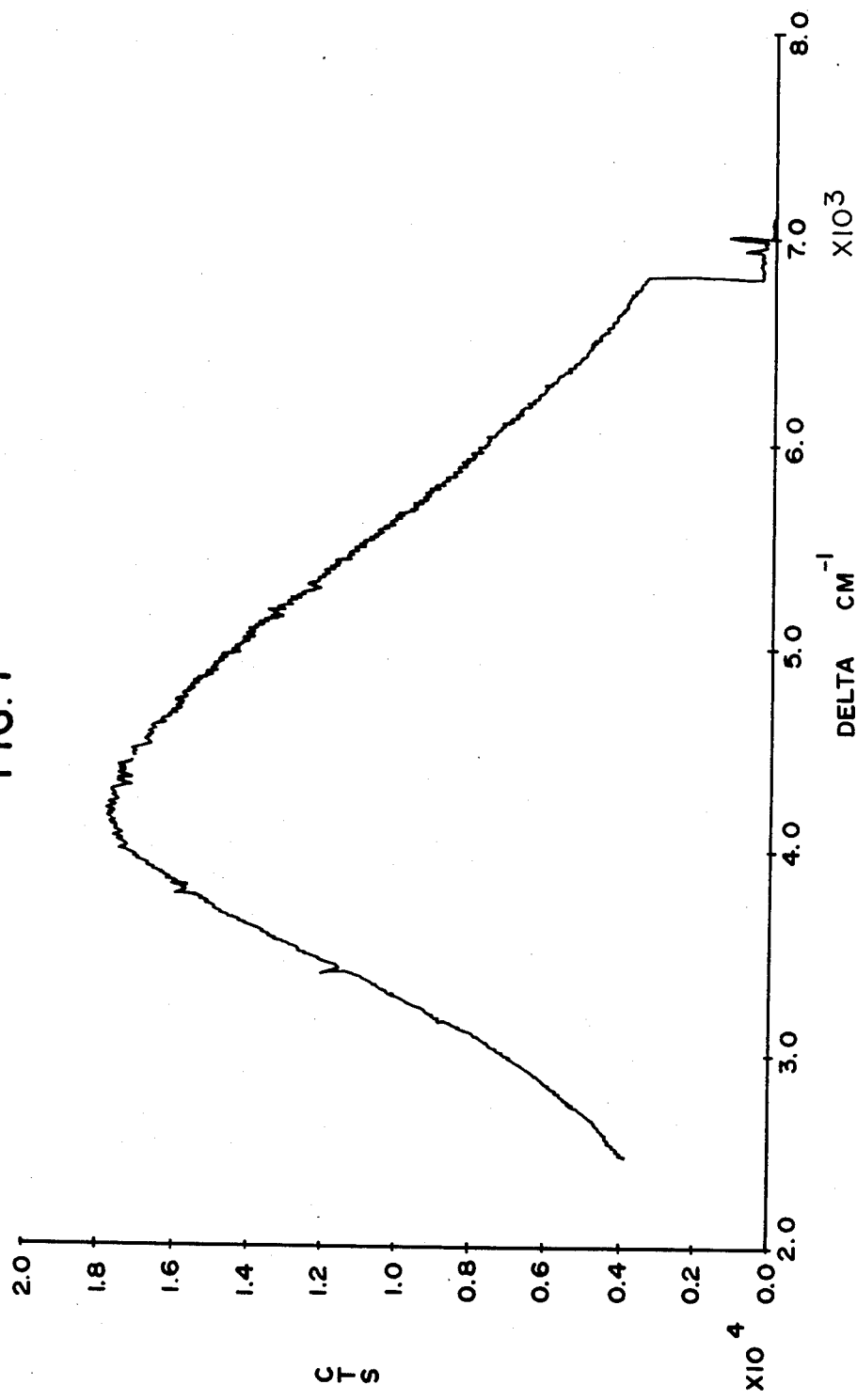
FIG. 7 is a diagram similar to FIG. 6 of the photoluminescent response of a crystal of monoclinic phosphorus according to the invention.

The photoluminescence spectra shown in FIGS. 6 and 7 were taken with an Argon laser Raman. A broad peak at 1.91 eV is clearly observed with a half width of about 0.29 eV. This indicates a band gap of about 2.1 eV at room temperature.

The FIG. 6 spectrum was taken utilizing a monoclinic crystal of phosphorus prepared in the presence of Cesium while the FIG. 7 spectrum was taken using monoclinic phosphorus condensed in the presence of rubidium.

Figure 8:
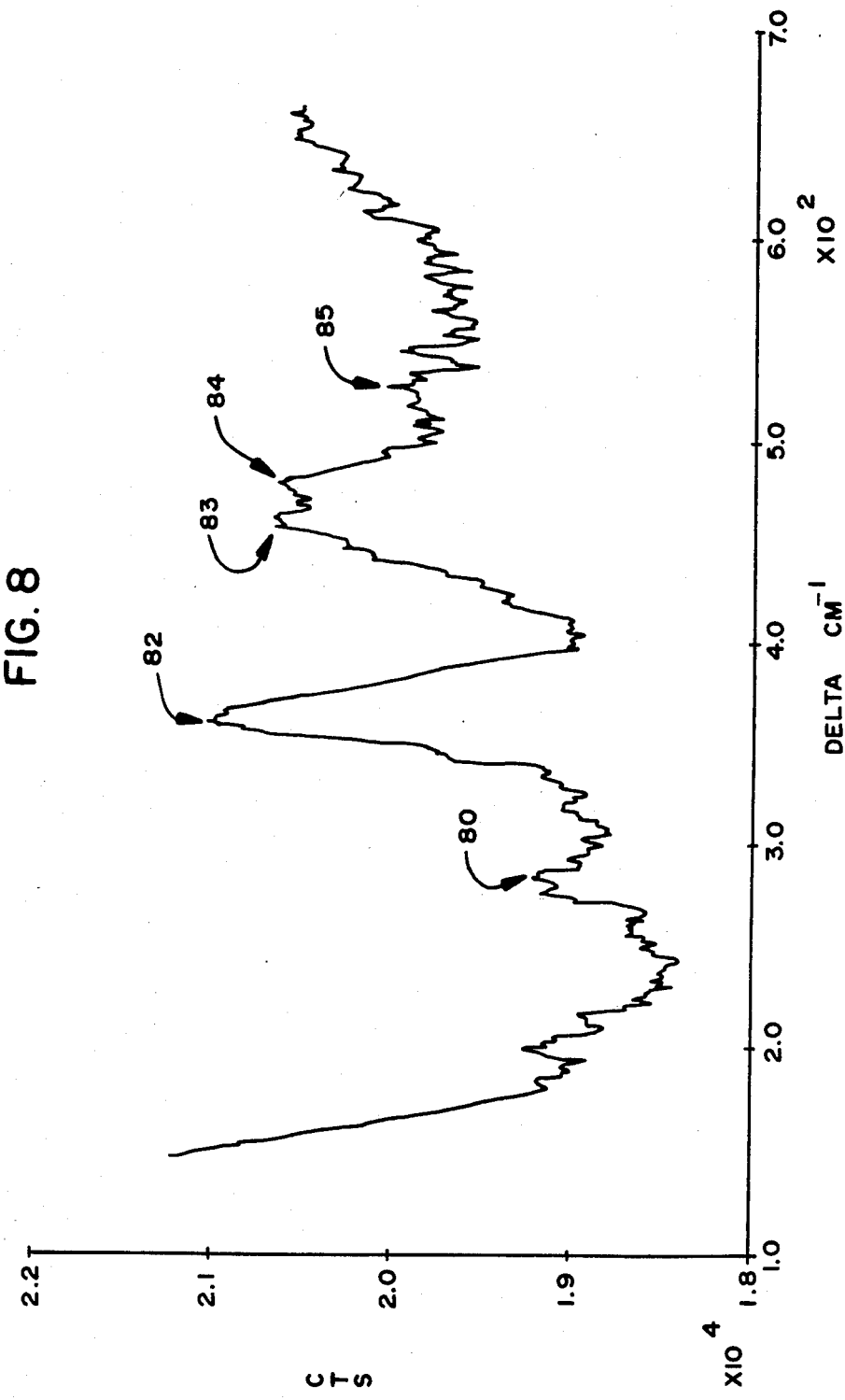
FIG. 8 is a Raman spectrum of monoclinic phosphorus according to the invention.

The Raman spectrum of FIG. 8 was taken utilizing a monoclinic phosphorus crystal formed in the presence of Rubidium. The peaks 80, 82, 83, 84, and 85 are at wave numbers 285, 367, 465, 483, and 529.

Evaporated dots about 25 micrometers in diameter were deposited on large crystals of monoclinic phosphorus (from a $Rb/P_{15}$ source) for electrical measurements. The resistance of the crystals was found to be $10^6$ ohm to $10^7$ ohm and practically independent of the geometry of the crystal and the size of the contacts. The data are dominated by surface resistance.

These crystals may be utilized as the substrate for depositing 3–5 materials such as Indium Phosphide or Gallium Phosphide. They may be utilized as phosphors in luminescent displays, semiconductors lasers, and as starting materials for other semiconducting devices.

The presence of the alkali metal in the charge appears to be crucial. We attempted to produce large single crystals of monoclinic phosphorus from 99.9999% pure red phosphorus by mimicking the conditions used successfully with the various alkali metal/phosphorus systems. This attempt failed. No monoclinic phosphorus was produced. For example, a 0.6 g sample of 99.9999% pure red phosphorus was heated at 552° C. in vacuo in a vertically positioned 10 mm outside diameter×6 mm inside diameter quartz tube. The temperature gradient between the bottom and top of the two and three-quarter inches long tube was 43° C. After heating for 24 hours, more than half of the charge had been transported to the top third of the tube where a boule had formed.

The boule consisted entirely of a red fibrous material. It is not monoclinic phosphorus however.

It will thus be seen that the objects set forth above among those made apparent from the preceding description are efficiently attained and that certain changes may be made in carrying out the above methods and in the above suppositions without departing from the scope of the invention. It is intended that all matter contained in the above description shall be interpreted as illustrative and not in a limiting sense.

It should be understood that all periodic table references herein are to the table printed in the inside front cover of the 60th Edition of the Handbook of Chemistry and Physics, published by the CRC Press, Inc., Boca Raton, Fla. Alkali metals are identified thereon and herein in Group 1a. All ranges stated herein are inclusive of their limits.

It is also to be understood that the following claims are intended to cover all of the generic and specific features of the invention and discovery herein described and all statements of the scope thereof which as a matter of language might be said to fall therebetween.

Particularly, it is to be understood that in said claims, ingredients or compounds recited in the singular are intended to include compatible mixtures of such ingredients whenever the sense permits.

Having described our inventions and discoveries, what we claim as new and desire to secure by Letters Patent is:

1. A crystal of monoclinic phosphorus having a largest dimension substantially greater than 0.2 mm and having between 50 to 2,000 ppm of alkali metal, said crystal formed by the process comprising the steps of providing a vapor phase of phosphorus and an alkali metal, and crystallizing said crystal from said vapor phase at a temperature substantially within the range of 500°–560° C.

2. A crystal of monoclinic phosphorus having a smallest dimension substantially greater than 0.05 mm and having between 50 to 2,000 ppm of alkali metal, said crystal formed by the process comprising the steps of providing a vapor phase of phosphorus and an alkali metal, and crystallizing said crystal from said vapor phase at a temperature substantially within the range of 500°–560° C.

3. A crystal of monoclinic phosphorous as defined in claims 1 or 2 crystallized at a temperature substantially equal to 539° C.

4. A crystal of monoclinic phosphorous as defined in claims 1 or 2 wherein said alkali metal is sodium.

5. A crystal of monoclinic phosphorous as defined in claims 1 and 2 wherein said alkali metal is potassium.

6. A crystal of monoclinic phosphorous as defined in claims 1 or 2 wherein said alkali metal is rubidium.

7. A crystal of monoclinic phosphorous as defined in claims 1 or 2 wherein said alkali metal is cesium.

8. A crystal of monoclinic phosphorous as defined in claims 1 or 2 wherein said vapor is formed at a temperature within the range of 546°–564° C.

9. A crystal of monoclinic phosphorus as defined in claim 8 wherein said vapor is formed at a temperature substantially equal to 555° C.

10. A crystal of monoclinic phosphorus as defined in claims 1 or 2 as the product of the steps of providing a vapor phase consisting essentially of phosphorus and an alkali metal, and crystallizing from said vapor phase said crystal of monoclinic phosphorus.

11. A crystal of monoclinic phosphorus, as defined in claims 1 or 2 wherein said crystal has a truncated pyramidal habit.

* * * * *